United States Patent
Roach et al.

(10) Patent No.: US 6,541,919 B1
(45) Date of Patent: Apr. 1, 2003

(54) ELECTRICAL INTERCONNECTION OF LIGHT-EMITTING FIBERS, AND METHOD THEREFOR

(75) Inventors: William R. Roach, Rocky Hill, NJ (US); Grzegorz Kaganowicz, Belle Mead, NJ (US); Bawa Singh, Voorhees, NJ (US)

(73) Assignee: Sarnoff Corporation, Princeton, NJ (US)

(*) Notice: Subject to any disclaimer, the term of this patent is extended or adjusted under 35 U.S.C. 154(b) by 65 days.

(21) Appl. No.: 09/698,913

(22) Filed: Oct. 27, 2000

Related U.S. Application Data
(60) Provisional application No. 60/182,156, filed on Feb. 14, 2000.

(51) Int. Cl.[7] .................................................. G06G 3/10
(52) U.S. Cl. ............................... 315/169.3; 315/169.1; 313/483; 345/76
(58) Field of Search ........................... 315/169.1, 169.2, 315/169.3; 313/483, 498, 508, 503, 511, 512; 345/74, 94, 76

(56) References Cited

U.S. PATENT DOCUMENTS

| | | | |
|---|---|---|---|
| 3,701,924 A | 10/1972 | Glaser | 315/84.6 |
| 4,782,336 A | 11/1988 | Bailey | 340/752 |
| 4,952,031 A | 8/1990 | Tsunoda | 350/342 |
| 5,106,181 A | 4/1992 | Rockwell, III | 385/2 |
| 5,177,405 A * | 1/1993 | Kusuda et al. | 315/169.1 |
| 5,300,862 A | 4/1994 | Parker et al. | 315/169.1 |
| 5,302,468 A | 4/1994 | Namiki et al. | 428/690 |
| 5,596,671 A | 1/1997 | Rockwell, III | 385/7 |
| 5,767,824 A | 6/1998 | Jacobsen | 345/55 |
| 6,078,138 A | 6/2000 | Iketsu | 313/504 |
| 6,229,266 B1 * | 5/2001 | Van Velzen et al. | 315/169.3 |
| 6,278,237 B1 * | 8/2001 | Campos | 313/483 |

FOREIGN PATENT DOCUMENTS

| | | |
|---|---|---|
| EP | 0 537 529 A1 | 4/1993 |
| JP | 09230802 | 9/1997 |
| WO | WO 00/51192 | 8/2000 |

OTHER PUBLICATIONS

International Search Report, PCT/US01/04814, Aug. 29, 2001, 3 pages.

"Flexible, Fiber–Based, Large–Area, Flat Pane Display Technology", Technical and Management Proposal #99= 13000–1–095, vol. 1, Mar. 26, 1999 (Business and Financial Data Redacted).

(List continued on next page.)

*Primary Examiner*—Don Wong
*Assistant Examiner*—Jimmy T. Vu
(74) *Attorney, Agent, or Firm*—William J. Burke (57) ABSTRACT

A number of light-emitting fibers in side-by-side array comprise a display. Each fiber includes a number of light-emitting elements disposed along the length of one surface of an optical fiber, such as an electro-luminescent material, e.g., an OLED material, disposed between hole injecting and electron injecting electrodes. Contacts on the top ones of the electrodes are connected by a conductor disposed transverse to the longitudinal direction of the fiber. The conductors are preferably deposited on the optical fibers by mask deposition, preferably utilizing masks adapted for contemporaneously depositing a metal conductor across a plurality of fibers. Electronic circuits having patterned conductors corresponding to the transverse conductors may be connected thereto by solder, conductive adhesive and the like.

30 Claims, 9 Drawing Sheets

OTHER PUBLICATIONS

Fred Weissortel, et al. "Spiros, Spiro–Spiros and Other Novel Amorphous Material for Blue Electroluminescence", Extended Abstracts, The Fourth International Conference on the Science and Technology of Display Phosphors, Sep. 14–17, 1998.

D.F. O'Brian, et al, Efficient Saturated Red Emission from a Phosphorescent Doped Organic Light Emitting Device, Extended Abstracts, The Fourth International Conference on the Science and Technology of Display Phosphors, Sep. 14–17, 1998.

E.W. Forsythe, et al, Interface Analysis of Naththyl–Substituted Benzidine Derivative and TRIS–8–(Hydroxy-quinoline) Aluminum Using Ultraviolet and X–Ray Protoemission Spectroscopy, Extended Abstracts, The Fourth International Conference on the Science and Techology of Display Phosphors, Sep. 14–17, 1998.

Y. Sato, et al, Red Emitting Organic EL Devices with Novel Dopants, Extended Abstracts, The Fourth International Conference on the Science and Technology of Display Phosphors, Sep. 14–17, 1998.

SID (Society for Information Display International Symposium Digest of Technical Papers) vol. XXX, May 18–20, 1999, Invited paper: Organic LED Full–Color Passive–Matrix Display. Y. Fukuda, et al, pp 430–433.

J.H. Burroughes, "High Efficiency Polymer Light Emitting Diodes", Extended Abstracts, The Fourth International Conference on the Science and Technology of Display Phosphors, Sep. 14–17, 1998.

S. Forrest, et al, "The Dawn of Organic Electronics", Organic Semiconductors are Strong Candidates for Creating Flexible, Full–Color Displays and Circuits on Plastic, IEEE Spectrum, Aug. 2000, pp 29–34.

* cited by examiner

ELECTRICAL INTERCONNECTION OF LIGHT-EMITTING FIBERS, AND METHOD THEREFOR

This Application claims the benefit of U.S. Provisional Application Serial No. 60/182,156 filed Feb. 14, 2000.

The present invention relates to electrical interconnection of adjacent electrical devices and, in particular, to electrical interconnection of light-emitting fibers and a method for interconnecting light-emitting fibers.

It has long been desired that electronic displays be made with larger screen sizes and also be very thin, ultimately reaching a configuration that may be hung on a wall. Inherent physical limitations preclude conventional cathode ray tubes, such as the color picture tubes and display tubes utilized in televisions, computer displays, monitors and the like, from achieving such desired result. While plasma displays have been proposed to satisfy such desire, the large glass vacuum envelope they require is difficult to manufacture and thus is expensive, which is not desirable.

The entire display screen of such plasma devices must be fabricated as a single piece and must reproduce many thousands of pixels. Any significant defect that results in faulty pixels or in a non-uniform brightness across the screen, even if confined to a relatively small area, renders the entire screen defective. Such defects cannot be tested or detected until the entire screen is processed, and are either not susceptible of repair or are very expensive to repair, thereby substantially reducing the yield and increasing the cost of each satisfactory plasma display.

One attractive approach for producing a large, thin display screen is to provide an array of a large number of adjacent light-emitting fibers. An advantage of such light-emitting fiber display is that each fiber is relatively inexpensive and may be separately tested before assembly into a display. Because defective fibers are detected and discarded before assembly into a display, the yield of a display which is made from known good light-emitting fibers is increased and the cost thereof is reduced. One such fiber display is described in U.S. Pat. No. 6,274,978 entitled "FIBER-BASED FLAT PANEL DISPLAY" (U.S. patent application Ser. No. 09/418,454 filed Oct. 15, 1999).

With regard to such fiber-based displays, it is desirable that the light-emitting fibers therefor be interconnected reliably and inexpensively, e.g., in a way that provides suitable performance, facilitates assembly of fibers into a display, and/or reduces cost. This is particularly of interest regarding the interconnections to conductors that are disposed transversely with respect to the side-by-side light-emitting fibers.

Accordingly, there is a need for an improved interconnection for light-emitting fibers.

To this end, the interconnection of the present invention comprises a plurality of electrical devices each having an edge surface having at least one exposed contact thereon, wherein the plural electrical devices are disposed side-by-side one another with the edge surfaces thereof residing substantially in a plane. At least one elongated electrical conductor is disposed substantially transverse to the edge surfaces of the electrical devices and on the respective edge surfaces thereof, wherein the at least one elongated conductor is in electrical connection with at least one of the exposed contacts on each of the plurality of electrical devices. An electrical circuit has at least one conductor proximal and substantially parallel to the at least one elongated conductor and connected thereto at a plurality of locations.

According to another aspect of the invention, an interconnection of plural light-emitting fibers comprises a plurality of lengths of a light-emitting fiber each having a plurality of light-emitting elements along a first surface thereof, each light-emitting element having at least one exposed contact; wherein the plural light-emitting fibers are disposed side-by-side one another. At least one elongated electrical conductor is disposed substantially transverse to the lengths of the light-emitting fibers and on the respective first surfaces thereof, wherein the at least one elongated conductor is in electrical connection with at least one of the exposed contacts on each of the plurality of light-emitting fibers.

Further, a method for interconnecting a plurality of electrical devices comprises:

placing in side-by-side array a plurality of electrical devices having an exposed contact disposed along respective first edge surfaces thereof, wherein the plurality of electrical devices are arrayed with the edge surfaces thereof and with the exposed contacts thereof in predetermined positional relationship;

depositing an elongated electrical conductor on the edge surfaces of the plurality of electrical devices to provide electrical connection between predetermined ones of the exposed contacts;

placing at least one conductor of an electrical circuit proximal and substantially parallel to the elongated electrical conductor; and connecting the one conductor of the electrical circuit to the elongated electrical conductor at a plurality of locations.

BRIEF DESCRIPTION OF THE DRAWING

The detailed description of the preferred embodiments of the present invention will be more easily and better understood when read in conjunction with the FIGURES of the Drawing which include.

In the Drawing, where an element or feature is shown in more than one drawing figure, the same alphanumeric designation may be used to designate such element or feature in each figure, and where a closely related or modified element is shown in a figure, the same alphanumerical designation primed may be used to designate the modified element or feature. It is noted that, according to common practice, the various features of the drawing are not to scale, and the dimensions of the various features are arbitrarily expanded or reduced for clarity.

DESCRIPTION OF THE PREFERRED EMBODIMENT

Figure 1A:
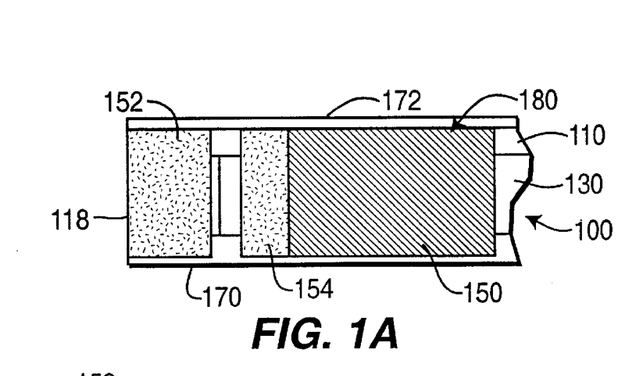
FIGS. 1A, 1B and 1C are schematic diagrams of a top view, side view and bottom view, respectively, of a portion of an exemplary embodiment of a light emitting fiber illustrating the fabrication and arrangement thereof.
Figure 1B:
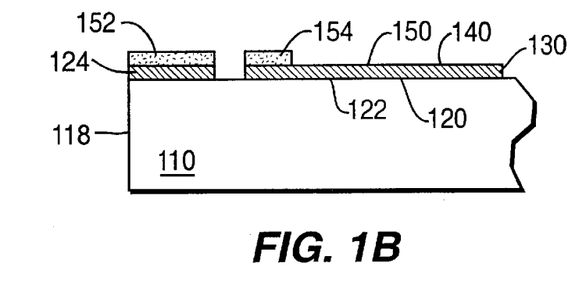
Figure 1C:
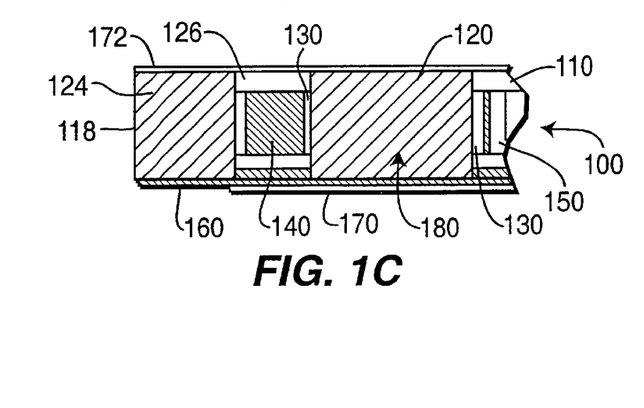
Figure 2:
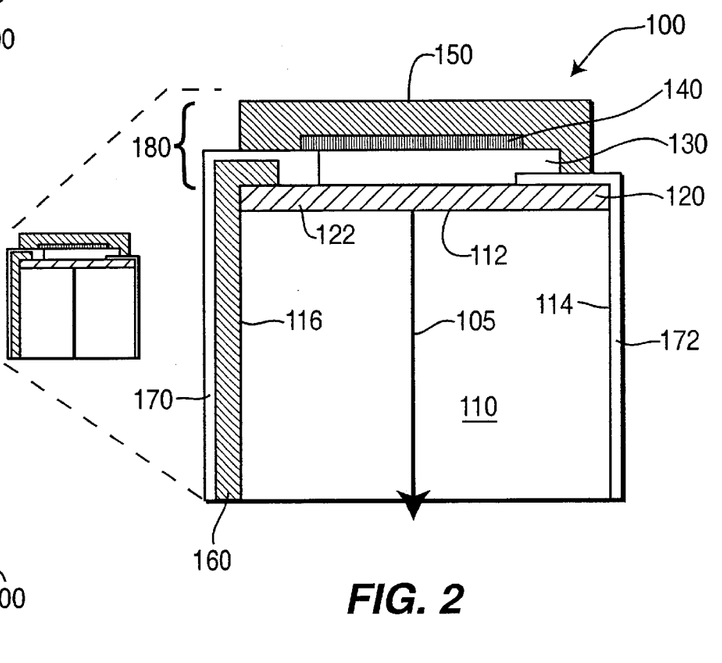
FIG. 2 is a schematic cross-sectional diagram of the exemplary light emitting fiber portion of FIGS. 1A–1C.

FIGS. 1A, 1B and 1C are schematic diagrams of a top view, side view and bottom view, respectively, of a portion of an exemplary light emitting fiber 100 and are better understood when considered in relation to FIG. 2 which is a schematic cross-sectional diagram of the exemplary light emitting fiber 100. A plurality of such fibers 100 are arrayed in side-by-side array, preferably being substantially contiguous, and are connected to appropriate electrical driver circuits for selectively and controllably energizing each light-emitting element (pixel) to produce a display for displaying an image or information. Image and/or information are used interchangeably with respect to what is displayed on a display device, and are intended to encompass any and all of the wide variety of displays that a user may desire, including, but not limited to, visual images and pictures, whether still or moving, whether generated by a camera, computer or any other source, whether true, representative or abstract or arbitrary, whether or not including symbols or characters such as alphanumeric characters or mathematical notations, whether displayed in black and white, monochrome, polychrome or full color.

Light-emitting fiber 100 is fabricated on a ribbon or fiber 110 of conventional optically transmissive material, such as glass, borosilicate glass, soda-lime glass, quartz, sapphire, plastic, polymethyl-methacrylate (PMMA), polycarbonate, acrylic, Mylar, polyester, polyimide or other suitable material. If chemical stability is of primary concern, then a quartz fiber is preferred, however, if flexibility is of importance, then a plastic fiber is preferred. A plurality of light-emitting elements 180 are provided along the length of fiber 110 on one of its surfaces 112 (e.g., a top surface 112). Light-emitting elements 180 include an electro-luminescent material, preferably an Organic Light-Emitting Diode (OLED) material, disposed between suitable electrodes. A quartz fiber may be preferred if chemical inertness is desired, and a plastic fiber may be preferred if greater flexibility is desired. Such ribbon or fiber is generally referred to herein as an optical fiber, it being understood that the material and physical size and shape of such ribbon or fiber may vary.

Each light-emitting element or OLED "stack" 180 includes at least a hole-injecting electrode 122, a layer of light-emitting OLED material 130 and an electron-injecting electrode 140, and is independently operable to produce one pixel of the image or information to be displayed. Alternatively light emission can occur in the electron (or hole) transport material in a region near the boundary with the hole (or electron) transport layer. In a color display, three physical pixel elements 180 may each produce one of three color sub-pixels that emit light of three different colors to together produce one color pixel of a color image.

Fiber 100 includes a segmented electrode layer 120 on top surface 112 of optical fiber 110 provided by a conductive layer 120, such as a thin layer of indium tin oxide (ITO), tin oxide, zinc oxide, combinations thereof, or another transparent hole-injecting material. Only a portion of light-emitting fiber 100 is shown in FIGS. 1A–1C. Each segment of ITO layer 120 serves as the hole injecting electrode 122 of OLED light-emitting element or stack 180. The spaces 126 between adjacent ITO electrodes 122 are of sufficient dimension along the length of fiber 110 for receiving an electrical contact 154 thereon for applying a data signal to light-emitting element 180, as described below. An electrically conductive bus 160, preferably of a highly conductive metal such as aluminum, copper, silver, gold, or chromium/gold (Cr Au), is provided on one side 116 of optical fiber 110 and slightly overlaps ITO layer 120 either on top surface 112 or on side surface 116 to make electrical contact to each ITO electrode 122 thereon for connecting the hole injecting electrode 122 of each light-emitting element 180 to a select input electrode 124 at one or both ends 118 of optical fiber 110. Electrical bus 160, which couples a select drive signal to the ITO electrodes 122 of each light-emitting element 180 along the length of optical fiber 110, is covered by an insulating layer 170.

A layer or stack 130 of OLED material is provided on segmented electrodes 122, which OLED layer 130 may or may not be segmented, and need not be segmented. OLED layer 130 does not overlie end ITO electrode 124. OLED stack 130 typically includes several different layers of material, each typically having a thickness of about 500 A. A segmented layer 140 of electron injecting material is provided over OLED layer 130, typically through the same mask that is utilized for deposition of the OLED hole transport and electron transport layers, and a relatively durable conductive segmented contact layer 150 is provided on segmented electrode layer 140 with the segments of layers 140 and 150 in registration. The aligned segment breaks of electrode layer 140 and contact layer 150 overlie spaces 126 of ITO layer 120 close to an edge of each ITO electrode 122. The segments of ITO layer 120 and of electron injecting/contact layers 140, 150 are thus of like pitch along the length of optical fiber 110 but are offset so that each segment of contact layer 150 overlies one ITO electrode 122 and provides a contact 154 to electrode 140 overlying the space 126 adjacent to the same one ITO electrode 122. Top electrode 140 may be a layer of magnesium, magnesium/silver, calcium, calcium/aluminum, lithium fluoride or lithium fluoride/aluminum, or any other stable electron injector. Contact layer 150 may be aluminum, gold, silver, chromium/gold (Cr Au) or copper, for example, or any other durable high-conductivity material. Top electrodes 140 and contacts 150 are in one-to-one correspondence with one another and with ITO contacts 120 along the length of optical fiber 110.

Contacts 154 are durable and provide a durable contact structure to which conductors providing pixel data signals are connected, which data signal conductors lie transverse to the length direction of light-emitting fibers 100 for interconnecting such fibers 100 in an array of a display, as described below. Because there is preferably no ITO electrode under the contact 154 portion of contact layer, the connecting of such transversely oriented data signal conductors to such contact 154 cannot cause a short circuit through or damage to OLED layer 130 between the hole injecting electrode 122 and the electron injecting electrode 140 of any light-emitting element 180. The deposition of contact layer 150 also produces a contact 152 at the end 118 of optical fiber 110 connecting directly to ITO end electrode 124 (there is no OLED layer 130 or insulator material overlying ITO electrode 124) and electrical bus 160 at the end 118 of optical fiber 110 to provide a durable contact structure to which conductors providing pixel select signals are connected.

Thus, suitable electrical connections can be made to couple the select signal and the data signal to respective electrodes 122 and 140 of each light-emitting element 180 for controllably and selectively energizing each light-emitting element 180 to produce the pixels of an image to be displayed by a display including a plurality of light-emitting fibers 100 in parallel side-by-side array. These connections are made to the surface of the light-emitting fibers 100 on which the light-emitting elements are formed, and the light emitted thereby passes through the optical fiber 110 away from the light-emitting elements 180 to be observed by a viewer of such display. It is noted that because light-emitting fibers 100 may be of any desired length, and because any desired number of such fibers 100 may arrayed side-by-side, a thin panel display of virtually any desired size (height and width) may be assembled utilizing the present invention.

Particularly in large displays, the lengths of select conductor 160 may become long and the resistance of a thin-film or other deposited conductor 160 may be higher than desired. Conductor 160 may be made thicker than the thicknesses obtainable by deposition of metals, such as by attaching thin strips of metal foil (e.g., 25–50 µm thick) along the length of fiber 100 and connected to each one of the ITO segments 122 by a spot of electrically-conductive epoxy or adhesive. Such strips 160 may be of aluminum, copper, silver, gold or other suitable metal, and may be in place of or in addition to the deposited strips 160. Where a metal foil strip 160 is employed in addition to a deposited conductor 160, the metal foil strip may be attached to deposited conductor 160 by electrically-conductive epoxy or adhesive, or may be simply be compressed against deposited conductor 160 by the (insulated) side of an adjacent fiber 100.

FIGS. 1A, 1B, 1C and 2 illustrate an arrangement of the layers of light-emitting fiber 100 that provides passivation of the OLED light-emitting elements 180. OLED layer 130 is segmented and insulating layers 170, 172 cover both edges of ITO layer 120. Insulating layers 170, 172 enable the edge of the OLED layer 130 segments to be on the insulators 170, 172 rather than extending to the edges of fiber 110. As a result, contact layer 150 can completely enclose OLED segments 130.

Passivation, which prevents or reduces moisture from reaching the OLED light-emitting elements 180 while not interfering with the making of electrical connection thereto, furthers achieving long life and high performance of the OLED light-emitting elements 180. In FIG. 1C, the electrode structure of light-emitting fiber 100 is visible, at least in part, through transparent optical fiber 110. Suitable moisture barrier materials include silicon nitride, silicon dioxide, silicon oxynitride, silicon carbide, diamond-like carbon, and phosphorus-silicate glass. Portions of electrode 140 that would be in spaces 126 are not needed for operability and may be eliminated with the expectation of improving the durability of contacts 154.

Contact layer 150 preferably extends beyond the width of OLED layer 130 (visible in FIGS. 1A and 2) to provide a metal layer 150 surrounding OLED layer 130. To prevent contact layer 150 from electrically shorting to ITO layer 120 or to electrical bus 160, insulation layer 170 covers electrical select bus 160 on side 116 of optical fiber 110 and insulation layer 172 covers side 114 and the edge of ITO layer 120 proximal side 114 of fiber 110, visible in FIG. 2. Portions of contact layer 150 may be utilized as pixel data contacts 154 and fiber select contact 152. Note that data contact 154 on top electrode 140, visible in FIG. 1B and 1C, lies completely in the space 126 between adjacent ITO electrodes 122. Also note that hole injection electrode 140, visible in FIG. 2, is of substantially the same width as is OLED layer 130, and is narrower than is contact layer 150.

Light emitted by light-emitting element 180 passes through optical fiber 110 to be observed by a viewer of the display including light-emitting fiber 100, as is indicated by arrow 105. While the light is generated in OLED material 130, it passes through the ITO or other thin material of electrode 120 in the direction indicated by arrow 105. The presence of top electrode 140 and/or contact layer 150 overlying OLED layer 130 desirably reflects light from OLED material 130 and so tends to increase the light output along the direction of arrow 105.

Where, for example, optical fiber 110 is about 0.25 mm (about 0.010 inch) wide, electrical bus 160 may overlie ITO electrode 122 by about 25 µm (about 0.001 inch) and insulator 170 may overlie bus 160 and ITO electrode 122 by about 50 µm (about 0.002 inch) along each side 114, 116 of fiber 110. Each OLED segment 130 may overlie insulators 170, 172 by about 25 µm (about 0.001 inch) and extends beyond the ends of ITO segment 122 by about 50 µm (about 0.002 inch). Metal top electrode 150 is spaced away from the sides 114, 116 of optical fiber 110 and extends beyond the ends of each OLED segment 130 and top electrode 140, by at least about 25 µm (about 0.001 inch). Metal electrode 150 thus seals the OLED segments 130 and serves as a passivating layer or moisture barrier therefor.

Where light-emitting fiber 100 is utilized in a color display, light-emitting elements 180 emitting three different colors of light, such as red (R), green (G) and blue (B), are utilized. The three different color light-emitting elements 180R, 180G, 180B are arranged to be in adjacent sets of R, G, B elements, each set providing a color pixel. Such arrangement of light-emitting elements 180R, 180G, 180B may be provided by sequencing R, G and B OLED materials 130 along the length of each light-emitting fiber 100 or may be provided by placing fibers 100 of different colors side-by-side in an R-G-B sequence, i.e. a red-emitting fiber 100R next to a green-emitting fiber 100G next to a blue-emitting fiber 100B and so forth. Red-emitting fiber 100R, green-emitting fiber 100G, and blue-emitting fiber 100B may be fabricated on ribbons or fibers 100 that are each tinted to the desired color or may employ different light-emitting materials that respectively emit the desired color.

Suitable small molecule OLED structures are known and include ITO as the hole injector, green-emitting OLED fabricated from naththyl-substituted benzidine derivative (NPB) as the hole transport layer, tris-(8-hydroxyquinoline) aluminum ($Alq_3$) as the electron transport layer, and magnesium/silver as the cathode, which are available commercially from Aldrich Chemical Company located in Milwaukee, Wis. and are reported by E. W. Forsythe et al in Extended Abstracts of The Fourth International Conference on the Science and Technology of Display Phosphors & 9th International Workshop on Inorganic and Organic Electroluminescence, Sep. 14–17, 1998, at page 53.

Red emission is obtained by doping the $Alq_3$ layer in the foregoing OLED structure doped with 6% 2,3,7,8,12,13,17, 18-octaethyl-21H,23H-porphine platinum (II) (PtOEP) as reported by D. F. O'Brien et al in the Extended Abstracts of The Fourth International Conference on the Science and Technology of Display Phosphors & 9th International Workshop on Inorganic and Organic Electroluminescence, Sep. 14–17, 1998, at page 37 et seq. Blue emission is obtained in the foregoing OLED structure by including an additional layer. This OLED structure includes spiro-linked TAD (spiro-TAD) as the hole transport layer, spiro-linked sexiphenyl (spiro-6Φ) as the blue emitter layer, and Alq$_3$ as the electron transport layer as reported by Frank Weissortel et al in Extended Abstracts of The Fourth International Conference on the Science and Technology of Display Phosphors & 9th International Workshop on Inorganic and Organic Electroluminescence, Sep. 14–17, 1998, at page 5 et seq.

Small-molecule OLED materials may be applied by evaporation and polymer OLED materials may be deposited as monomers, for example, using ink jet printing, roller coating, screen printing and the like to deposit mixtures of the OLED material and suitable solvents as is known, and subsequently evaporating the solvent(s) and polymerizing the monomer by heating.

For a polymer OLED structure, ITO may be employed as the hole injector layer and polyethylene dioxythipene, commonly known as PEDOT, doped with polystyrene sulfonic acid (PEDOT:SS) available from Bayer A.G. located in Ludwigshafen, Germany, or PVK poly-N-carbazole available from Aldrich Chemicals, as the hole transport layer. The electron transport/emissive layer can by a poly(fluorene)-based polymer for green emission, and other polymers for red and blue emission, as reported by J. H. Burroughes in the Extended Abstracts of The Fourth International Conference on the Science and Technology of Display Phosphors & 9th International Workshop on Inorganic and Organic Electroluminescence, Sep. 14–17, 1998, at page 133 et seq.

Such green-emitting OLED materials typically provide brightness levels of about 100 cd/m$^2$ and exhibit power efficiencies of about 1, 11 and 5 lumens/watt for the R, G and B materials, respectively.

Figure 3:
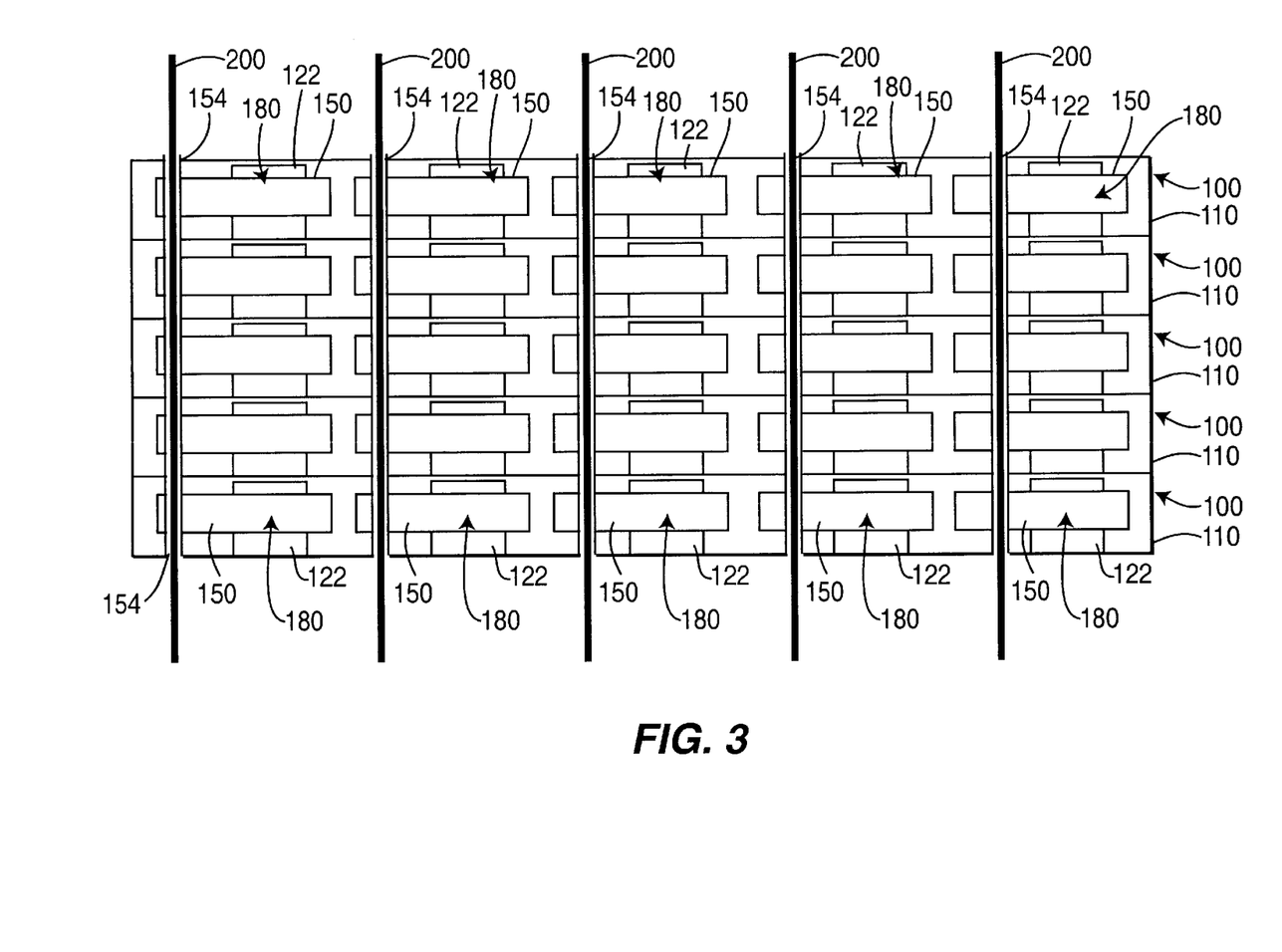
FIG. 3 is a plan view schematic diagram of a plurality of exemplary light-emitting fibers electrically interconnected in side-by-side array, a portion thereof being illustrated.

FIG. 3 is a plan view schematic diagram of a plurality of exemplary light-emitting fibers 100 electrically interconnected in side-by-side array, a portion of five adjacent side-by-side fibers 100 being illustrated. Each light-emitting fiber 100 includes a plurality of light-emitting elements 180 disposed along its length, each light-emitting element having a hole--injecting (ITO) electrode segment 122 disposed on an optical fiber 110, an OLED layer 130 on electrode segment 122 and a top electrode and contact 140/150 on the OLED layer, as described above. Each top electrode 140/150 has a contact 154 at one end thereof that is aligned with the corresponding top electrodes 140/150 of corresponding light-emitting elements 180 of the other fibers 100. Electrical conductors 200 are disposed transversely to the longitudinal direction of light-emitting fibers 100 and each conductor 200 is in electrical contact with a set of aligned ones of top contacts 154.

As a result, the display provided by the side-by-side array of light-emitting fibers 100 includes an array of light-emitting elements 180, i.e. pixel elements, each having an ITO electrode adapted to receive first electrical drive signals (e.g., select signals) via an electrical conductor 160 disposed along the side 116 of optical fiber 110 and a second electrical drive signal (e.g., a data signal) via an electrical conductor 200 disposed transversely with respect to the display array.

In general, transverse electrical interconnecting conductors 200 may be formed by evaporating or otherwise depositing metal strips 200 across the array of light-emitting fibers 100 and overlying the top contacts 154 for interconnecting contacts 154 for applying the data drive signals thereto. The small gap, if any, between adjacent light-emitting fibers 100 may be bridged by deposited metal if sufficiently small and/or by a drop or dollop of electrically insulating material applied at the locations where conductors 200 bridge between adjacent fibers 100. Suitable materials include, for example, adhesive, epoxy, optical cement and the like, to provide a fillet surface on which the metal of conductor 200 lies.

Alternatively, interconnecting conductors 200 may be metal strips that are placed transversely to fibers 100 onto drops or dollops of electrically conductive adhesive that have been placed on contacts 154 of fibers 100. Suitable metals for metal strips 200 include, for example, copper, aluminum, silver, gold and the like.

Figure 4A:
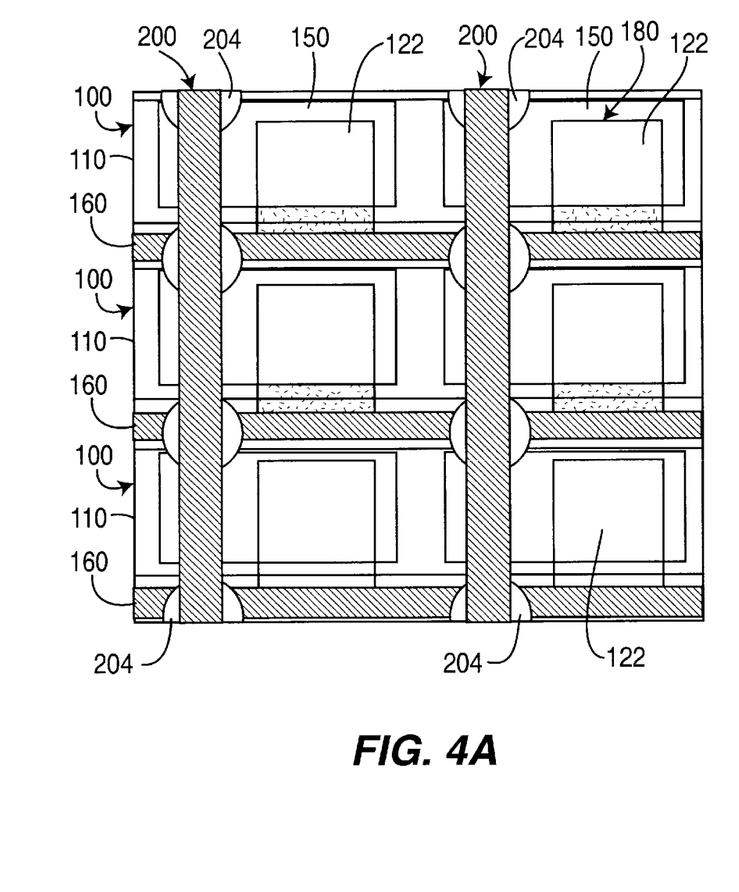
FIGS. 4A and 4B are plan view and end view schematic diagrams, respectively, of the portion of the exemplary light-emitting fiber array of FIG. 3.
Figure 4B:
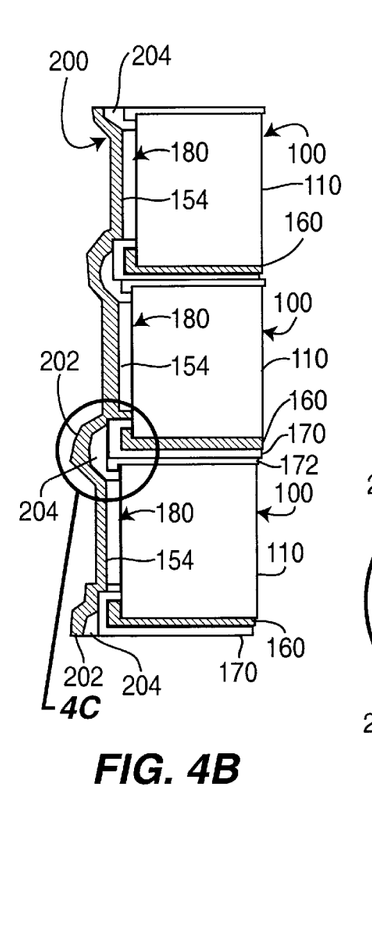
Figure 4C:
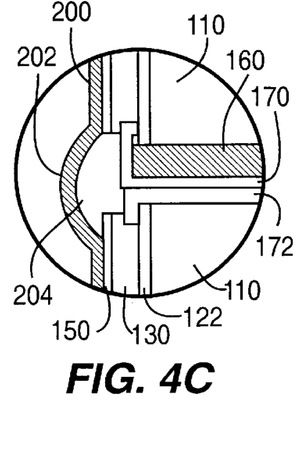
FIG. 4C is an enlarged detail of a portion of FIG. 4B.

FIGS. 4A and 4B are enlarged plan view and end view schematic diagrams, respectively, of a portion of three of the exemplary light-emitting fibers 100 of the array of FIG. 3 illustrating the material 204 that bridges any gap between adjacent fibers 100. Plural drops of material 204 can be applied in the required pattern using any suitable process, such as by inkjet printing, screen printing, dispensing, or by capillary fill from the viewing surface (opposite the surface 112 on which light-emitting elements 180 are disposed). The fillets of material 204 provide surfaces on which conductors 200 maybe deposited, such as by evaporation of metal through a simple mask, thereby tending to "planarize" the surfaces of adjacent fibers 100 facilitating providing a reliable interconnection between contacts 154 on adjacent fibers 100, as illustrated in the enlarged detail of FIG. 4C. The enlarged detail shows the portion 202 of conductor 200 that is on fillet material 204 and shows the arrangement of insulators 170, 172 in relation to (select) signal conductor 160 and transverse (data signal) conductor 200 for providing insulation therebetween.

In addition, material 204 provides locations that do not overlie or closely abut light-emitting elements 180 at which electrical connections may be made to conductors 200 and contacts 154 of the array of light-emitting fibers 100. Advantageously, with respect to each light-emitting element 180, conductor 200 overlies two spots of material 204, one proximal each end of contact 154 of each light-emitting element 180. Thus, there are at least two locations at which electrical connection can be made to each light-emitting element 180, thereby providing redundancy that improves reliability. Moreover, material 204 can also provide mechanical support and attachment for fibers 100 and for holding fibers 100 in the desired side-by-side arrangement.

Figure 5A:
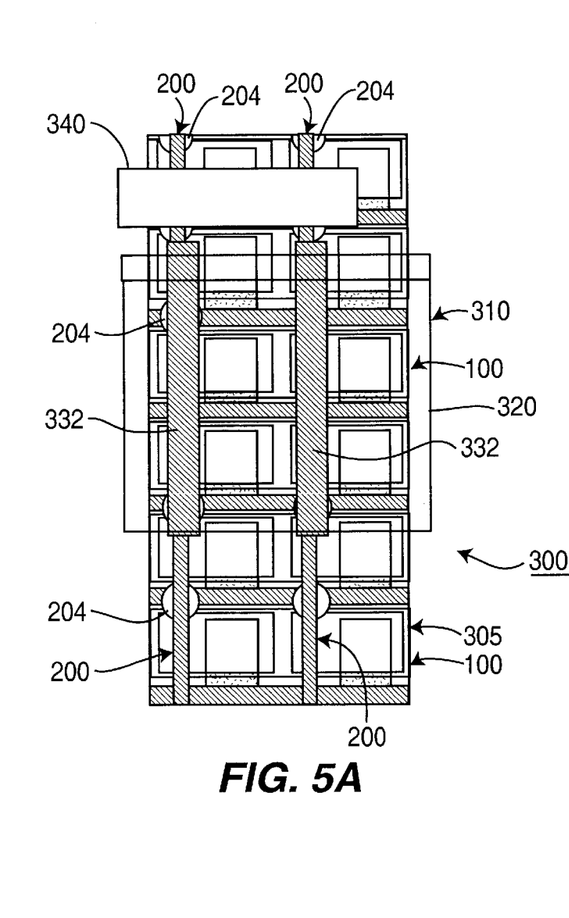
FIGS. 5A and 5B are plan view and end view schematic diagrams, respectively, of a portion of an exemplary light-emitting display module including the portion of the exemplary light-emitting fiber array of FIGS. 4A and 4B.
Figure 5B:
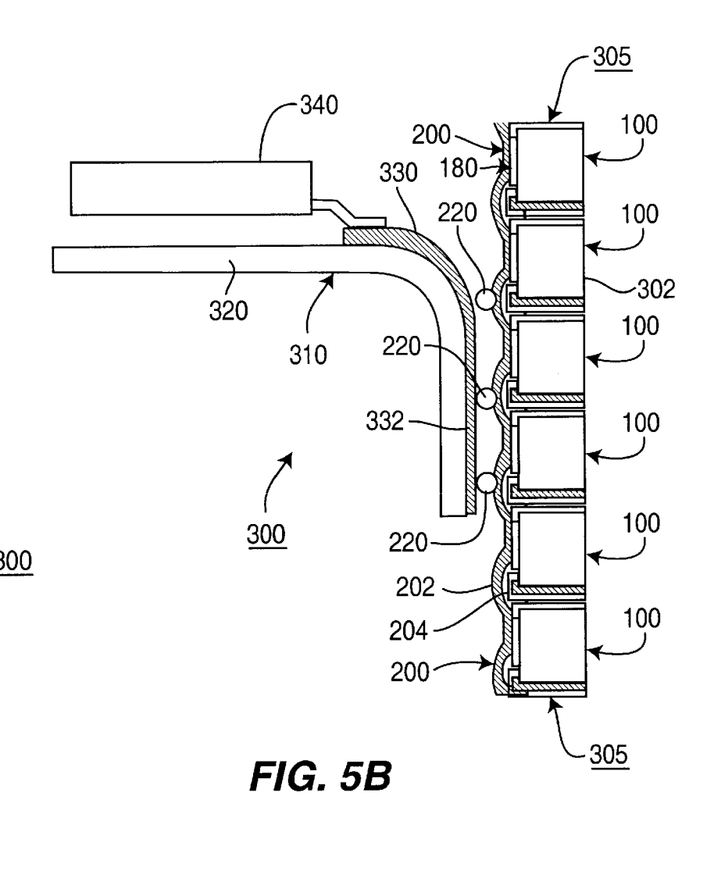

FIGS. 5A and 5B are plan view and end view schematic diagrams, respectively, of a portion of an exemplary light-emitting display module 300 including the portions of six side-by-side exemplary light-emitting fibers 100 of an array of the sort shown in FIGS. 3, 4A and 4B. Module 300 includes plural light-emitting fibers 100 arrayed in parallel side-by-side arrangement 305 and an electronic circuit 310 coupled thereto for providing electrical drive signals, such as select signals and/or data signals, for the light-emitting elements 180 thereon. Array 305 of side-by-side fibers 100 includes transverse conductors 200 as described above.

Electronic circuit 310 includes, for example, a circuit substrate 320, such as a flexible printed circuit board, on which are patterned conductors 330 providing electrical connections to an electronic drive circuit 340 that generates the drive signals and light-emitting fiber array 305. Electronic drive circuit 340 is, for example, an integrated circuit, hybrid circuit, microelectronic circuit or other electronic device that produces drive signals, such as data drive signals, to be applied to the electrodes of light-emitting elements 180 of the fibers 100 of fiber array 305. Patterned conductors 320 are preferably in substantially parallel spaced-apart relationship at the end of circuit substrate 320 distal driver circuit 340 and proximal fiber array 305.

More particularly, patterned conductors 330 are preferably spaced apart at like pitch to the substantially parallel spaced-apart conductors 200 on fiber array 305, thereby providing conductors 332 that facilitate a direct and simple interconnection between ones of the patterned conductors 330 of electronic circuit 310 and the corresponding conductors 200 of fiber array 305. As shown in FIG. 5A in which circuit substrate 320 is shown as transparent so that fiber array 305, conductors 200 and patterned conductors 332 are visible, conductors 332 are positioned over and substantially parallel to conductors 200 and, as shown in FIG. 5B, are interconnected to conductors 200 at a plurality of connections 220. Connections 220 are, for example, solder, indium, silver-filled or other electrically conductive epoxy, or other suitable material which may be dispensed to the appropriate sites. Preferably, connections 220 are located along conductors 200 at the portions 202 thereof where conductors 200 cross over the fillet of material 204, but this need not be the case, for example, particularly where the OLED material 130 is not under contacts 154 of the light-emitting elements 180. Alternatively, the materials of conductors 200 and 332 may be selected so that conductors 200 and 332 may be directly connected, such as by direct bonding, without the need for providing plural discreet globs of connecting material 220.. In any event, connections may be made by heating, laser heating, and/or exposure to ultraviolet (UV), as is appropriate to the materials utilized.

Advantages of this arrangement include that the interconnection between electronic circuit 310 and fiber array 305 is by plural connections 220, thereby providing redundancy and increasing reliability, as well as increased mechanical support as the number of connections increases. Moreover, if conductor 200 were to develop a break, it is likely that electrical connection to each pixel element 180 of each fiber 100 will be maintained because most locations along each conductor 200 connect to a conductor 332 via two independent circuit paths. In addition, with connections 220 located at portions 202 of conductors 200, if a break in conductor were to occur in portion 202 thereof, as may be more likely than at other locations, connection to conductor 200 at both sides of the break therein is likely to be maintained by connection 220 connecting to a broad area of conductor 200 proximate such location.

As a result, the coupling of electrical drive signals to each pixel element 180 of each fiber 100 of module 300 is likely to be maintained despite a number of breaks or faults, thereby providing a robust and reliable product.

Another advantage is that each fiber does not have to be connected to each drive conductor 332, thereby eliminating the necessity to make a direct connection between a conductor 332 on circuit board 310 and the light-emitting fibers 100 at or near the edges of module 300. This advantage provides for convenient positioning of circuit boards 310 in modules 300 in ways the do not interfere with adjacent modules 300, even if certain components of a particular module extend beyond the edges of the fibers 100 of that module 300, as is seen in relation to FIGS. 6A and 6B.

Figures 6A, 6B:
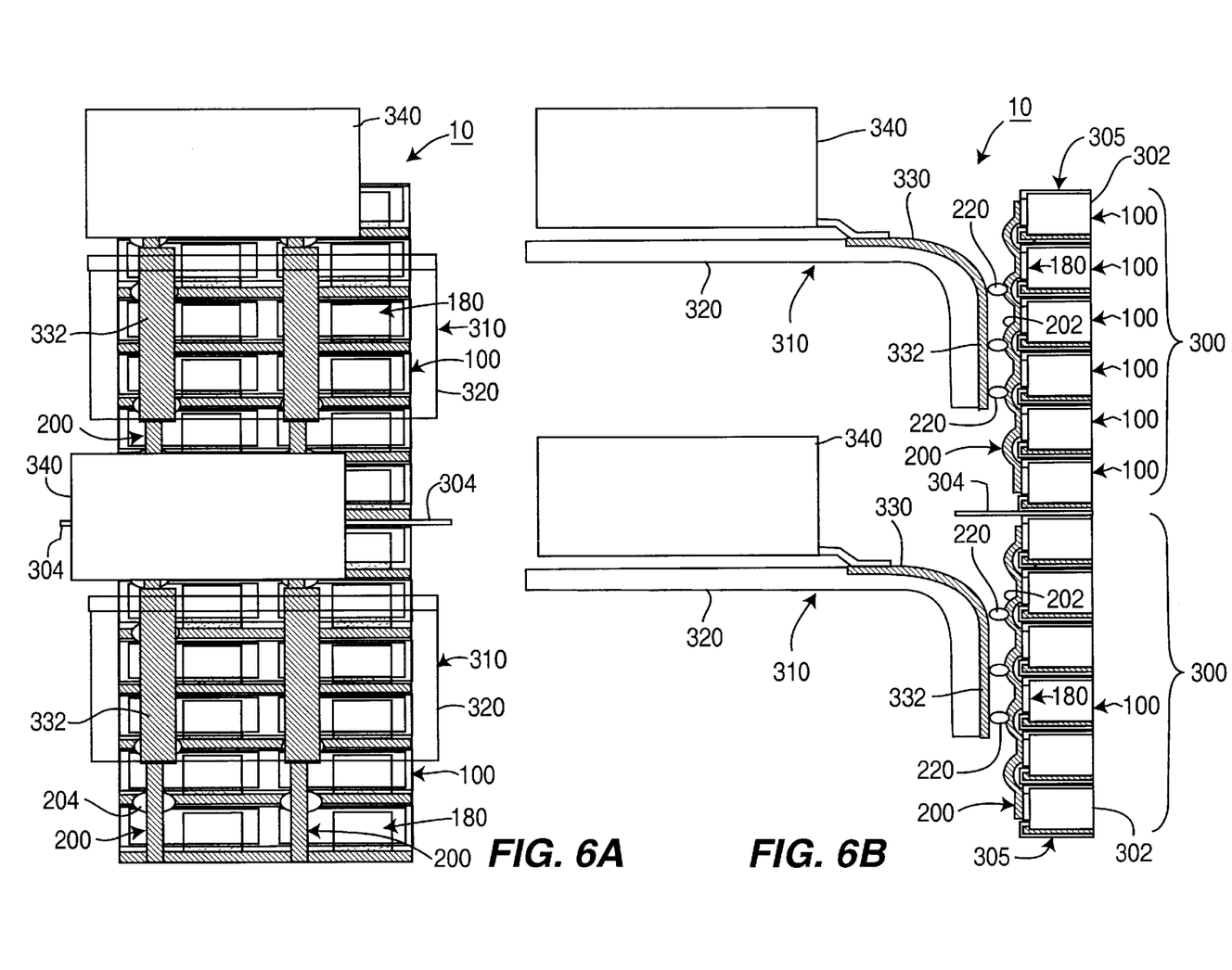
FIGS. 6A and 6B are plan view and end view schematic diagrams, respectively, of a portion of an exemplary light-emitting display including exemplary light-emitting modules as in FIGS. 5A and 5B.

FIGS. 6A and 6B are plan view and end view schematic diagrams, respectively, of a portion of an exemplary light-emitting display 10 including exemplary light-emitting modules 300 as in FIGS. 5A and 5B (circuit boards 320 being transparent for purposes of illustration as above). Two modules 300 are shown as an example, and any desired number of modules 300 may be employed for providing a display having a viewing screen of any desired size. Display modules 300 are arranged with their viewing surfaces 302 being generally in a plane to provide a planar viewing screen, unless a curved or other shaped viewing screen is desired. Modules 300 are arranged in abutting relationship so that there is little space between the end light-emitting fibers 100 of adjacent modules 300, so that the modular nature of the display, while very convenient and cost-effective for manufacturing, is not evident to a viewer.

Modules 300 are insulated from each other by a thin insulating spacer 304 that prevents contacts or other electrical conductors of the end light-emitting fibers 100 that abut each other to not short circuit. Spacer 304 may be a sheet of Mylar or other plastic, e.g. about ¼ to ½ mil (about 6–13 $\mu$m) thick, or may be provided by an insulating layer, such as layers 170 or 172 deposited on at least the end fiber 100 or by spacing the ends of conductors 200 away from the edge of the end fiber 100. For purposes of illustration, electronic device 340 is shown as being very high so as to extend above circuit substrate 320 a substantial distance. Thus device 340 extends out of the space behind the fibers 100 of the module 300 of which it is a part and into the space behind the adjacent module 300, and yet does not interfere with any of the components of the adjacent module or its assembly into a display 10.

Figure 7A:
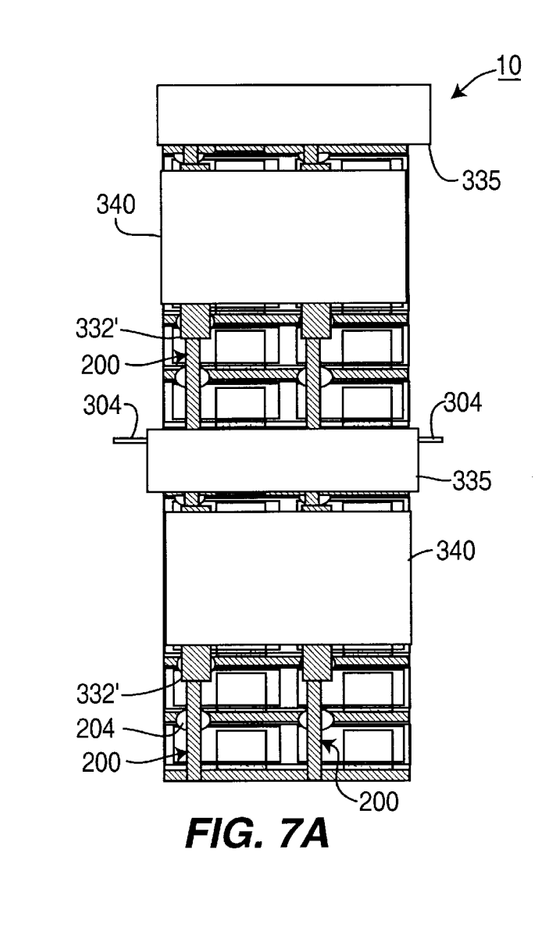
FIGS. 7A and 7B are plan view and end view schematic diagrams, respectively, of a portion of an exemplary light-emitting display including an alternative embodiment of exemplary light-emitting modules similar to FIGS. 5A and 5B.
Figure 7B:
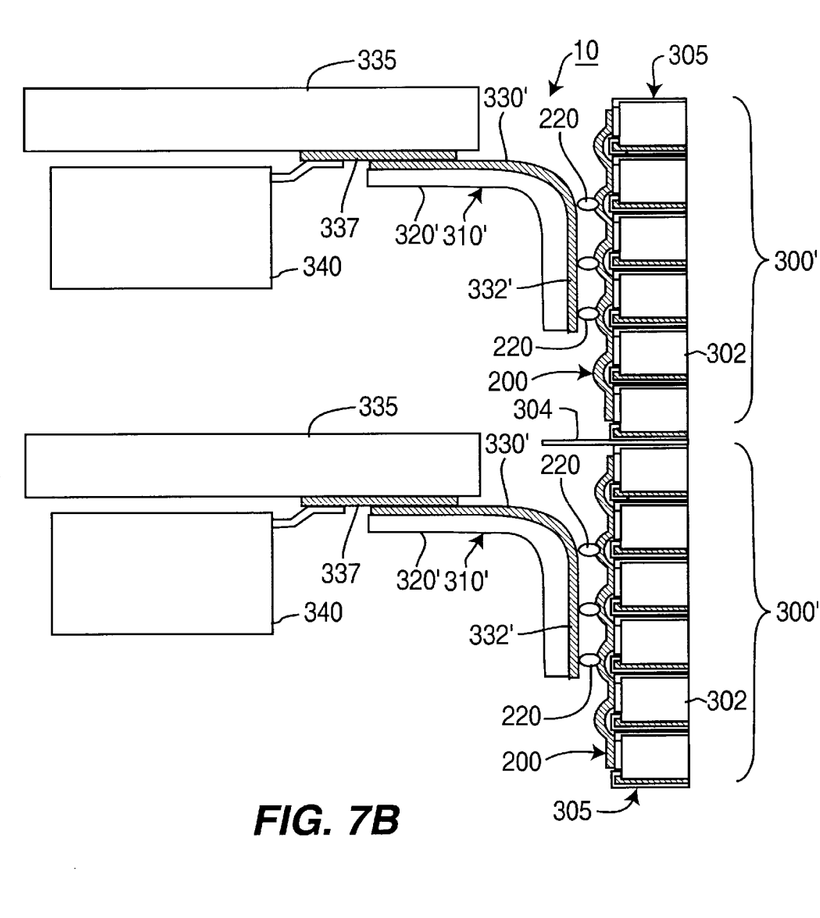

FIGS. 7A and 7B are plan view and end view schematic diagrams, respectively, of a portion of an exemplary light-emitting display 10 as above including an alternative embodiment of exemplary light-emitting modules 300' similar to FIGS. 5A and 5B (flexible cables 320' being transparent for purposes of illustration as above). Modules 300' each include an array 305 of light-emitting fibers 100 and an electronic circuit 310' providing drive signals therefor. Module 300' differs from module 300 in the arrangement of electronic circuit 310' which includes a rigid substrate 335, such as a printed circuit board or ceramic substrate, on which electronic device 340 is mounted and a flexible circuit board 320 or flexible cable 320'. Electronic device 340 connects via conductors 337 of rigid substrate 335 to conductors 330 of flexible cable 320 which have end portions 332 that connect to conductors 200 as described above. Advantages associated with module 300' include that the drive device 340 and circuit board 335 are easily tested before assembly to fiber array 305 and that only a small piece of the relatively expensive flexible cable 320' or flexible printed circuit board 320 is needed. In addition, printed circuit board 335 may be a single-sided circuit board, which is inexpensive, or may be a double-sided or a plural-layer circuit board, as is desirable and convenient.

Figure 8A:
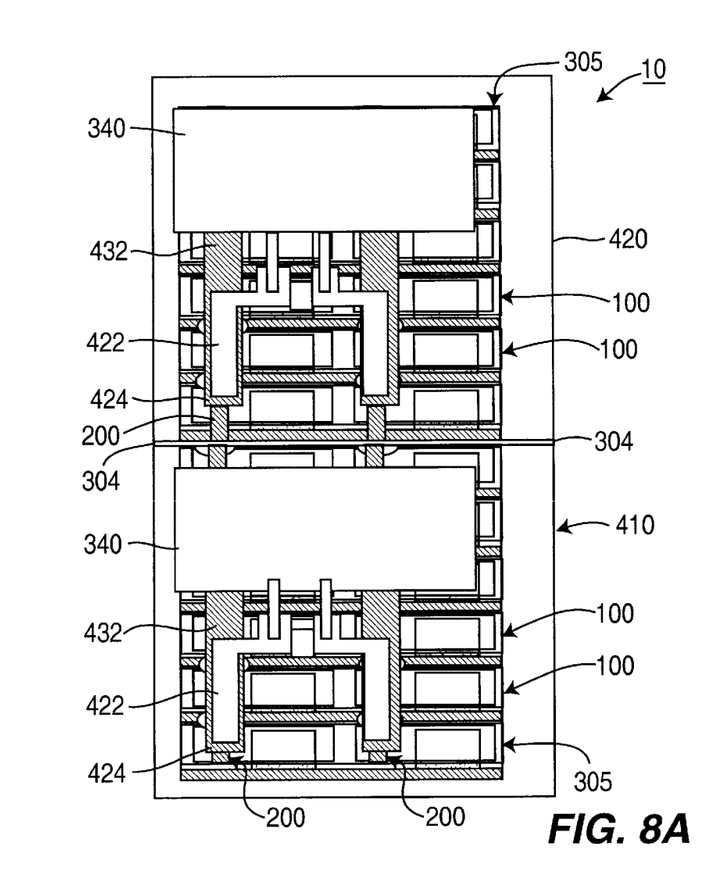
FIGS. 8A and 8B are plan view and end view schematic diagrams, respectively, of a portion of an exemplary light-emitting display including an alternative electronic circuit arrangement and an exemplary light-emitting fiber array portion as in FIGS. 4A and 4B.
Figure 8B:
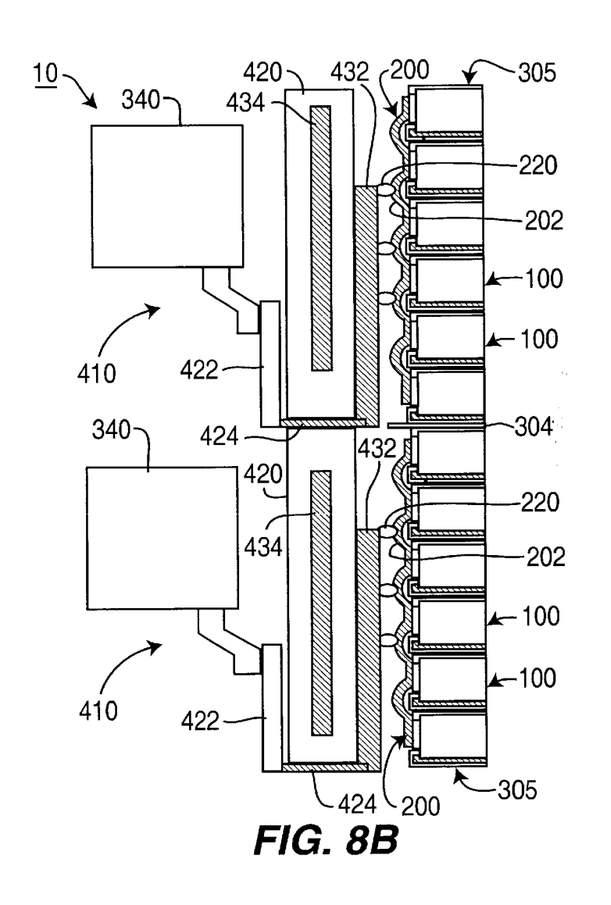

FIGS. 8A and 8B are plan view and end view schematic diagrams, respectively, of a portion of an exemplary light-emitting display 10 including an alternative electronic circuit arrangement 410 and an exemplary light-emitting fiber array 305 portion as in FIGS. 4A and 4B (circuit board 420 being transparent for purposes of illustration as above). Display 10 includes for example, two fiber arrays 305 in abutting relationship to provide a substantially planar viewing surface, as described above. Electrical drive circuits for the light-emitting fibers 100 of fiber arrays 305 are on a rigid electronic circuit board 410 positioned behind each of fiber arrays 305, for example, a rigid printed circuit board. Circuit board 410 includes on a single electronic circuit substrate 420 at least one electronic device 340 for providing electrical drive signals, e.g., select signals and data signals, to light-emitting fibers 100 via conductors 432 disposed in substantially parallel spaced apart arrangement of the surface of circuit substrate 420 facing fiber arrays 305. Conductors 432 of circuit board 410 are interconnected by conductive material 220 to corresponding conductors 200 disposed transverse to the longitudinal direction of light-emitting fibers 100 of fiber arrays 305.

To accommodate the coupling of input signals and other electrical signals to electronic devices 340 and the coupling of select and/or data signals and/or other signals from devices 340, circuit substrate 420 preferably has plural layers enabling internal conductors 434 for power and ground signals and for providing cross over connections between ones of conductors 422 on a first surface of circuit board 420 and conductors 432 on the opposing surface thereof. Connections between conductors on different surfaces or layers of circuit substrate 420 are by conductive vias 424 or plated through holes 424, as is conventional in plural layer printed circuit boards and ceramic substrates. Because the pitch of the light-emitting pixel elements 180 of fibers 100 is relatively small, e.g., about 250 µm (about 10 mils) transverse to the fibers 100 and about 750 µm (about 30 mils) along fibers 100, tolerances in the positions of vias 424 in relation to conductors 422 and 432 must be controlled.

Thus, the arrangement of FIGS. 8A and 8B are better suited to modest size displays, such as for smaller televisions, video monitors and computer displays, e.g., those having a screen diagonal less than about 50 cm (about 20 inches).

Figure 9:
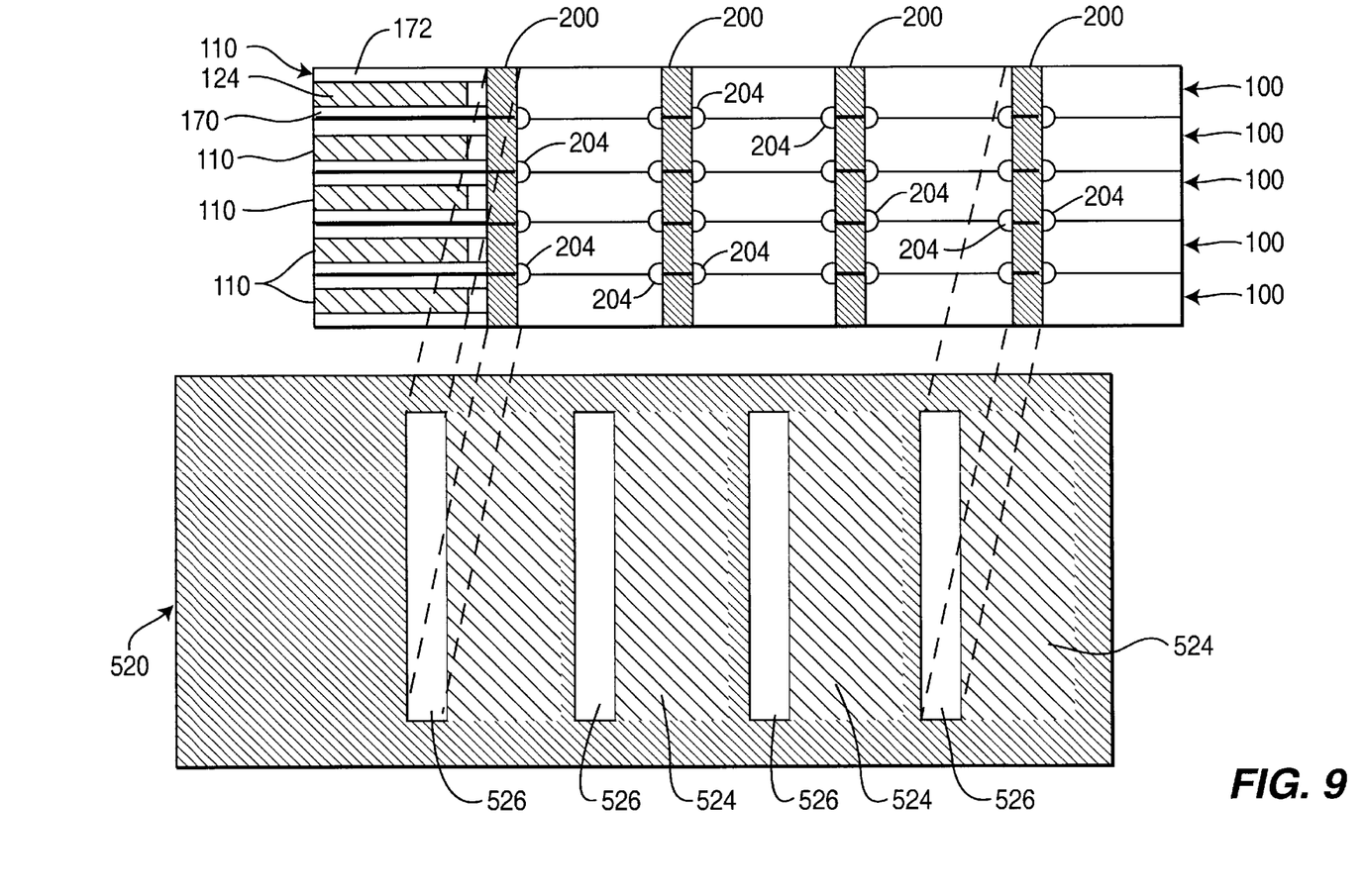
FIG. 9 is an exemplary mechanical mask for defining the shape and size of conductors transverse to a plurality of light-emitting fibers.

FIG. 9 is an exemplary mechanical mask 520 for defining the shape and size of conductors 200 transverse to a plurality of light-emitting fibers 100. Mechanical mask 520 has a peripheral masking portion 522 and transverse bridging masking portions 524 bridging between opposite sides of mask 520 to define plural mask openings 526 through which conductive metal conductor material such as aluminum, copper, gold or other suitable metal is deposited for forming conductors 200 on a plurality of optical fibers 110 that are arranged in side-by-side touching relationship, as illustrated. Bridging mask portions 524 extend in a direction transverse to the long dimension of optical fibers 110. Bridging mask portions 524 block areas of each of optical fibers 110 on which metal conductor material is not deposited, i.e. the areas of light-emitting elements 180. Conductor metal may be deposited by any convenient method, such as by sputtering or evaporation. For example, on an optical fiber of about 0.25 mm (about 0.010 inch) width, mask slots 526 may be about 100 µm (about 0.004 inch) wide in the direction along the length of optical fibers 110 and on a pitch of about 0.75 mm (about 0.030 inch), thereby to define conductors 200 that are about 25 µm (about 0.004 inch) wide.

Figure 10:
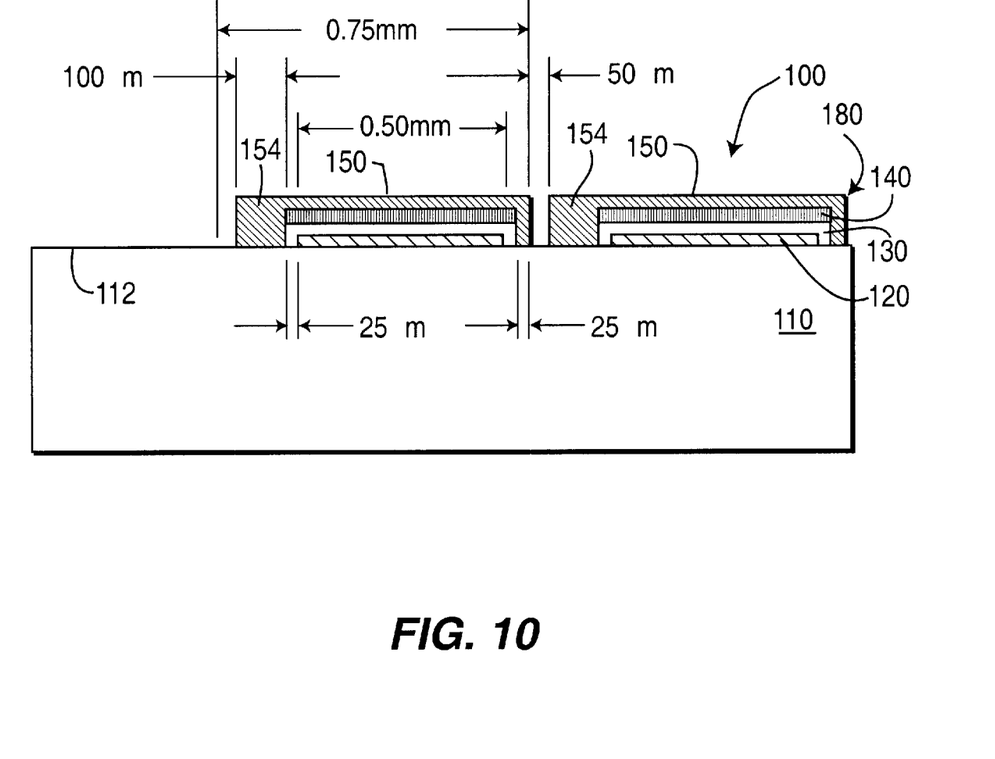
FIG. 10 is a side view schematic diagram illustrating exemplary dimensions of an exemplary light-emitting fiber.

FIG. 10 is a side view schematic diagram illustrating exemplary dimensions of a portion of an exemplary light emitting fiber 100. For example, in a high-definition television (HDTV)display having a screen diagonal measurement of about 175 cm (about 66 inches) and a 16:9 aspect ratio, the image includes 1920×1080 full color pixels and each full color pixel includes three monochrome (red, green and blue) pixels. Transverse alignment and longitudinal registration of the optical fibers 110 is required for placement of conductors 200. Such longitudinal registration is less than about 25–50 µm (about 1–2 mils) given the about 0.1 mm (about 0.004 inch) width of contacts 154.

Typical dimensions for an about 0.25 mm (about 10 mil) wide optical fiber 110 include: about 0.50×0.25 mm (about 0.020×0.010 inch) pixels on an about 0.75 mm (about 0.030 inch) pitch, and having a contact layer of about 0.70×0.25 mm (about 0.028×0.010 inch) thereover. This allows a spacing of about 50 µm (about 0.002 inch) between adjacent contact layers 150 and a contact 154 area of about 0.1×0.25 mm (about 0.004×0.010 inch) at one end of contact layer 150. It also allows OLED layer 130 and top electrode 140 to overlap ITO electrode 120 by about 25 µm (0.001 inch) at each end. It is noted that it is desirable that the contact 154 not overlie OLED layer 130 which is the active area of light-emitting element 180 so that OLED layer 130 is not damaged when connection is made to contact 154, such as by probe for testing or by attachment to an external conductor 200 by compression, solder or electrically conductive epoxy. Conductors 200 have a width of about 0.1 mm (about 0.004 inch) corresponding to contact 154 and extend a sufficient length to lie across the desired the number of about 0.25 mm (about 10 mil) wide optical fibers 110.

It is noted that while the interconnection arrangement described herein including conductors 200 disposed transverse across plural light-emitting fibers 100, as for a display, the interconnection according to the present invention is suitable for making electrical connection between adjacent electrical devices be they electrical elements on adjacent fibers, conductors on adjacent circuit boards, contacts on adjacent electronic devices, and the like, as well as between adjacent devices of different types and kinds.

While the present invention has been described in terms of the foregoing exemplary embodiments, variations within the scope and spirit of the present invention as defined by the claims following will be apparent to those skilled in the art. For example, other materials and dimensions may be utilized is making the light-emitting fibers according to the invention, as well as the circuit modules and components thereof. Conductors 200 may be made thicker than the thicknesses obtainable by deposition of metals, such as by attaching thin strips of metal foil (e.g., 25–50 µm thick) across a plurality of fibers 100 and connected to each one by a spot of electrically-conductive epoxy or adhesive. Such strips 200 may be of aluminum, copper, silver, gold or other suitable metal, and may be in place of or in addition to the deposited strips 200 described above.

In addition, flexible and rigid circuit substrates may generally be interchanged in an embodiment, as is convenient. While conductors 200 are illustrated in exemplary fashion as being transverse, e.g., perpendicular, to the lengths of the light-emitting fibers, such conductors need not be perpendicular to the fibers and may be angled as convenient. Conductors 200 need not be straight, as illustrated, by may curve of be non-lineal, also as is convenient. Such angled and/or non-lineal conductors may be referred to as being substantially transverse to the fibers.

What is claimed is:

1. An interconnection of plural light-emitting fibers comprising:

a plurality of lengths of a light-emitting fiber each having a plurality of light-emitting elements along a first surface thereof, each light-emitting element having at least one exposed contact; wherein said plural light-emitting fibers are disposed side-by-side one another; and at least one elongated electrical conductor substantially transverse to the lengths of said light-emitting fibers and disposed on the respective first surfaces thereof, wherein said at least one elongated conductor is in electrical connection with at least one of the exposed contacts on each of said plurality of light-emitting fibers.

2. The interconnection of claim 1 further comprising a material underlying said elongated electrical conductor for bridging at least part of a gap between adjacent ones of said plurality of light-emitting fibers, wherein said material includes one of an electrically insulating material and an electrically conductive material.

3. The interconnection of claim 2 further comprising an electronic circuit having at least one conductor positioned proximal said at least one elongated conductor and connected thereto at a plurality of locations, wherein at least one of the locations overlies said material.

4. The interconnection of claim 3 wherein the at least one conductor of said electronic circuit is connected to said at least one elongated conductor by one of solder, electrically conductive epoxy and silver filled epoxy.

5. The interconnection of claim 1 further comprising an electronic circuit having at least one conductor positioned proximal said at least one elongated conductor and connected thereto at a plurality of locations.

6. The interconnection of claim 1 wherein said at least one elongated electrical conductor is formed of a material selected from the group consisting of aluminum, gold, silver, copper, chromium, alloys thereof, and combinations thereof.

7. The interconnection of claim 1 wherein said at least one elongated electrical conductor is formed by one of deposition, evaporation, and sputtering of a metal and electrically bonding a strip of metal.

8. The interconnection of claim 1 wherein said light-emitting fiber comprises an optically transparent fiber having light-emitting elements thereon including one of an inorganic electro-luminescent material and an organic light-emitting material.

9. The interconnection of claim 8 wherein the optically-transparent fiber includes a material selected from the group consisting of glass, borosilicate glass, soda-lime glass, quartz, sapphire, plastic, polymethyl-methacrylate (PMMA), polycarbonate, acrylic, Mylar, polyester, and polyimide.

10. The interconnection of claim 8 wherein the electrical contact of at least one of said plurality of light-emitting elements overlies a portion of an exposed electrode that does not overlie one of the inorganic electro-luminescent material and the organic light-emitting material.

11. A display comprising:
a plurality of lengths of a light-emitting fiber each having a plurality of light-emitting elements along a first surface thereof, each light-emitting element having at least one exposed contact; wherein said plural light-emitting fibers are disposed side-by-side one another with surfaces opposite the first surfaces thereof providing a viewing surface for the display;
at least one elongated electrical conductor substantially transverse to the lengths of said light-emitting fibers and disposed on the respective first surfaces thereof, wherein said at least one elongated conductor is in electrical connection with at least one of the exposed contacts on each of said plurality of light-emitting fibers; and
an electronic circuit having at least one conductor positioned proximal said at least one elongated conductor and connected thereto at a plurality of locations.

12. The display of claim 11 further comprising a material underlying said elongated electrical conductor for bridging at least part of a gap between adjacent ones of said plurality of light-emitting fibers, and wherein said material includes one of an electrically insulating material and an electrically conductive material.

13. The display of claim 12 wherein at least one of the locations at which the at least one conductor of said electronic circuit connects to said elongated conductor overlies said material.

14. The display of claim 11 wherein the at least one conductor of said electronic circuit is connected to said at least one elongated conductor by one of solder, electrically conductive epoxy and silver filled epoxy.

15. The display of claim 11 wherein said at least one elongated electrical conductor is formed by one of deposition, evaporation, and sputtering of a metal and electrically bonding a strip of metal, and wherein said metal is selected from the group consisting of aluminum, gold, silver, copper, chromium, alloys thereof, and combinations thereof.

16. The display of claim 11 wherein each said light-emitting fiber comprises an optically transparent fiber having light-emitting elements thereon including one of an inorganic electro-luminescent material and an organic light-emitting material.

17. The display of claim 16 wherein the optically-transparent fiber includes a material selected from the group consisting of glass, borosilicate glass, soda-lime glass, quartz, sapphire, plastic, polymethyl-methacrylate (PMMA), polycarbonate, acrylic, Mylar, polyester, and polyimide.

18. The display of claim 16 wherein the electrical contact of at least one of said plurality of light-emitting elements overlies an exposed electrode that does not overlie the one of the inorganic electro-luminescent material and the organic light-emitting material.

19. A display comprising: a plurality of display modules in side-by-side abutting relationship, each said display module comprising:
a plurality of lengths of a light-emitting fiber each having a plurality of light-emitting elements along a first surface thereof, each light-emitting element having at least one exposed contact; wherein said plural light-emitting fibers are disposed side-by-side one another with surfaces opposite the first surfaces thereof providing a viewing surface for the display;
at least one elongated electrical conductor substantially transverse to the lengths of said light-emitting fibers and disposed on the respective first surfaces thereof, wherein said at least one elongated conductor is in electrical connection with at least one of the exposed contacts on each of said plurality of light-emitting fibers; and
an electronic circuit having at least one conductor positioned proximal said at least one elongated conductor and connected thereto at a plurality of locations.

20. The display of claim 19 further comprising a material underlying said elongated electrical conductor for bridging at least part of a gap between adjacent ones of said plurality of light-emitting fibers.

21. The display of claim 20 wherein at least one of the locations at which the at least one conductor of said electronic circuit connects to said elongated conductor overlies said material.

22. A method for interconnecting a plurality of light-emitting fibers comprising:
placing in side-by-side array a plurality of light-emitting fibers having a plurality of light-emitting elements and exposed light-emitting element contacts disposed along respective first surfaces thereof, wherein the plurality of light-emitting fibers are arrayed with the first surfaces thereof and with the exposed contacts thereof in predetermined positional relationship; and depositing an elongated electrical conductor on the first surfaces of the plurality of light-emitting fibers to provide electrical connection between predetermined ones of the exposed contacts.

23. The method of claim 22 wherein said depositing an elongated electrical conductor includes first depositing a material to bridge at least part of a gap between adjacent ones of the plurality of light-emitting fibers, and then depositing the elongated electrical conductor on the first surfaces of the plurality of light-emitting fibers and on the deposited material.

24. The method of claim 22 wherein said depositing includes masking the plurality of light-emitting fibers in side-by-side array for contemporaneously depositing the elongated conductor on each of the plurality of light-emitting fibers.

25. The method of claim 22 wherein said depositing an elongated electrical conductor includes one of depositing, evaporating, and sputtering a metal and electrically bonding a strip of metal, wherein the metal is selected from the group consisting of aluminum, gold, silver, copper, chromium, alloys thereof, and combinations thereof.

26. An interconnection of plural electrical devices comprising:
a plurality of electrical devices each having an edge surface having at least one exposed contact thereon, wherein said plural electrical devices are disposed side-by-side one another with the edge surfaces thereof residing substantially in a plane;
at least one elongated electrical conductor substantially transverse to the edge surfaces of said electrical devices and disposed on the respective edge surfaces thereof, wherein said at least one elongated conductor is in electrical connection with at least one of the exposed contacts on each of said plurality of electrical devices; and
an electrical circuit having at least one conductor proximal and substantially parallel to said at least one elongated conductor and connected thereto at a plurality of locations.

27. The interconnection of claim 26 further comprising a material underlying said elongated electrical conductor for bridging at least part of a gap between adjacent ones of said plurality of electrical devices, and wherein said material includes one of an electrically insulating material and an electrically conductive material.

28. The interconnection of claim 26 wherein said at least one elongated electrical conductor is formed by one of deposition, evaporation, and sputtering of a metal, wherein said metal is selected from the group consisting of aluminum, gold, silver, copper, chromium, alloys thereof, and combinations thereof, and wherein the at least one conductor of said electrical circuit is connected to said at least one elongated conductor by one of solder, electrically conductive epoxy and silver filled epoxy.

29. A method for interconnecting a plurality of electrical devices comprising:
placing in side-by-side array a plurality of electrical devices having an exposed contact disposed along respective first edge surfaces thereof, wherein the plurality of electrical devices are arrayed with the edge surfaces thereof and with the exposed contacts thereof in predetermined positional relationship;
depositing an elongated electrical conductor on the edge surfaces of the plurality of electrical devices to provide electrical connection between predetermined ones of the exposed contacts;
placing at least one conductor of an electrical circuit proximal and substantially parallel to the elongated electrical conductor; and
connecting the one conductor of the electrical circuit to the elongated electrical conductor at a plurality of locations.

30. The method of claim 29 wherein said depositing an elongated electrical conductor includes first depositing a material to bridge at least part of a gap between adjacent ones of the plurality of electrical devices, and then depositing the elongated electrical conductor on the edge surfaces of the plurality of electrical devices and on the deposited material.

* * * * *